United States Patent
Ma et al.

(10) Patent No.: US 10,535,613 B2
(45) Date of Patent: Jan. 14, 2020

(54) SEMICONDUCTOR STRUCTURE, INTEGRATED CIRCUIT DEVICE, AND METHOD OF FORMING SEMICONDUCTOR STRUCTURE

(71) Applicant: TAIWAN SEMICONDUCTOR MANUFACTURING CO., LTD., Hsinchu (TW)

(72) Inventors: Shih-Hsien Ma, Taichung (TW); Haw-Chuan Wu, Kaohsiung (TW); Shih-Hao Tsai, Tainan (TW); Yu-Chuan Lin, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/893,452

(22) Filed: Feb. 9, 2018

(65) Prior Publication Data

US 2018/0166395 A1    Jun. 14, 2018

Related U.S. Application Data

(62) Division of application No. 14/854,958, filed on Sep. 15, 2015, now Pat. No. 9,893,019.

(51) Int. Cl.
*H01L 23/552* (2006.01)
*H01L 21/027* (2006.01)

(52) U.S. Cl.
CPC ........ *H01L 23/552* (2013.01); *H01L 21/0276* (2013.01)

(58) Field of Classification Search
None
See application file for complete search history.

(56) References Cited

U.S. PATENT DOCUMENTS

| | | | | |
|---|---|---|---|---|
| 5,851,877 A | * | 12/1998 | Ho | H01L 21/32139 438/253 |
| 6,717,267 B1 | * | 4/2004 | Kunikiyo | H01L 23/5283 257/758 |
| 6,833,578 B1 | * | 12/2004 | Tu | H01L 27/11 257/300 |
| 9,054,164 B1 | | 6/2015 | Jezewski et al. | |
| 2012/0193757 A1 | * | 8/2012 | Shih | H01L 28/90 257/532 |
| 2015/0024533 A1 | * | 1/2015 | Chang | B81C 1/00214 438/49 |
| 2016/0336264 A1 | * | 11/2016 | Rullan | H01L 23/528 |
| 2018/0145083 A1 | * | 5/2018 | Tong | G11C 17/16 |

* cited by examiner

*Primary Examiner* — Shaun M Campbell
(74) *Attorney, Agent, or Firm* — Maschoff Brennan

(57) ABSTRACT

A semiconductor structure, integrated circuit device, and method of forming semiconductor structure are provided. In various embodiments, the semiconductor structure includes a substrate containing a high topography region and a low topography region, an outer protection wall on an outer peripheral portion of the high topography region next to the low topography region, and an anti-reflective coating over the outer protection wall, the high topography region, and the low topography region.

20 Claims, 5 Drawing Sheets

SEMICONDUCTOR STRUCTURE, INTEGRATED CIRCUIT DEVICE, AND METHOD OF FORMING SEMICONDUCTOR STRUCTURE

RELATED APPLICATION

The present application is a Divisional Application of the U.S. application Ser. No. 14/854,958, filed on Sep. 15, 2015, now U.S. Pat. No. 9,893,019, issued Feb. 13, 2018, which is incorporated herein by reference in its entirety.

BACKGROUND

The topography of a semiconductor structure is getting increasingly crucial in the manufacture of a multi-level integrated circuit device. The topography variation can result from different number of deposition layers in different regions of the semiconductor structure, in which an area with higher topography is more susceptible to the etching in a photolithographic process than a lower topography area.

Typically, a protection film is applied over the entire higher topographic area to prevent such area from damage of the etching. Nonetheless, the desired property of optical materials utilized, e.g., an anti-reflective coating to attenuate or absorb light reflected from the substrate surface into a subsequent photoresist, in the lithographic process is usually affected by the protection film.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
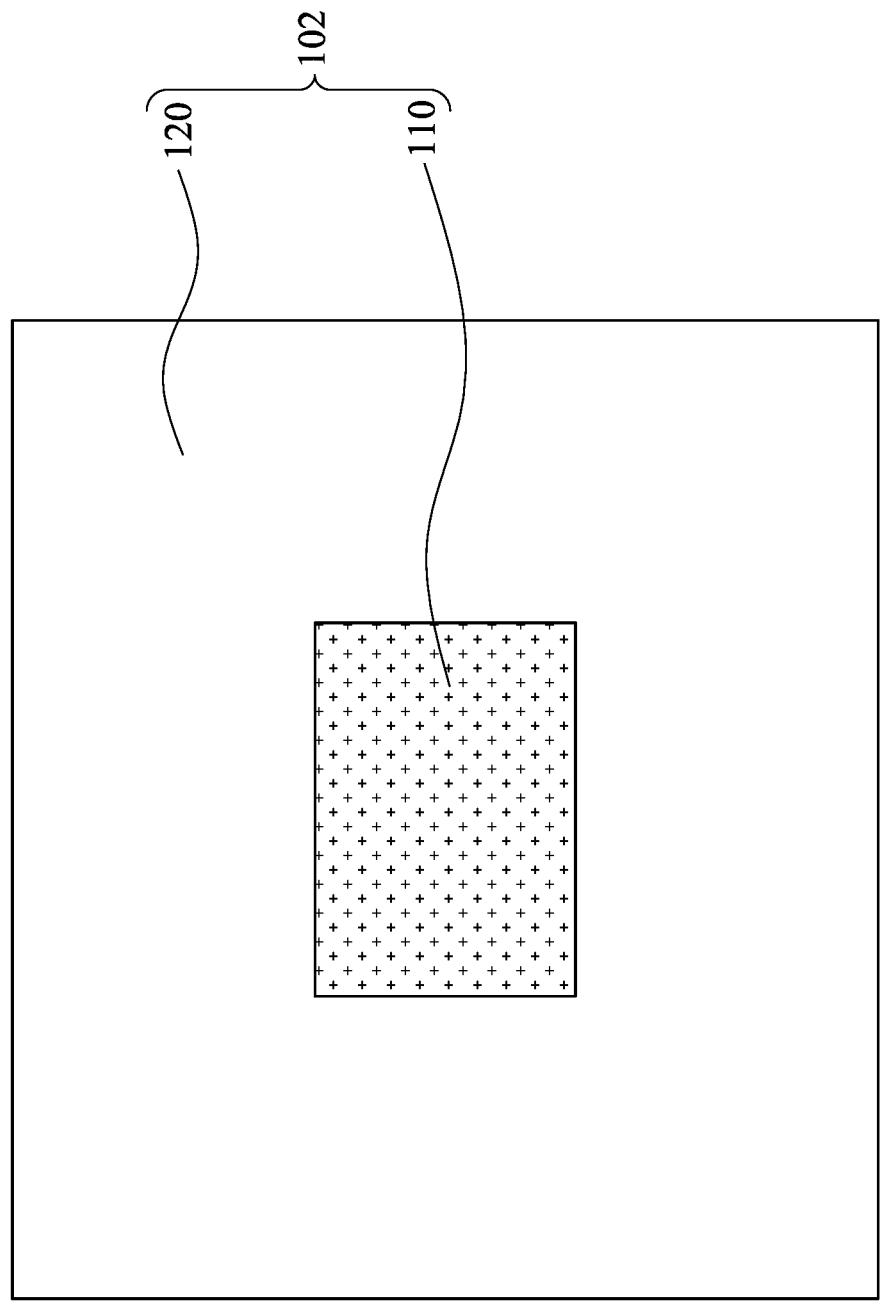
FIG. 1 is a representative top down view of an implementation of a semiconductor structure, in accordance with some embodiments.

The following disclosure provides various embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a topography region includes aspects having two or more such topography regions, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although the present disclosure is explained by references of the formation of a semiconductor structure in an integrated circuit device, it will be appreciated that it is equally applicable to any lithographic manufacturing process where the semiconductor structure can be advantageously formed on a surface of a substrate.

With reference to FIG. 1, there is an illustrated top view of a schematic area arrangement of a semiconductor structure 100. The semiconductor structure 100 can be referred to as an integrated circuit device in some embodiments. In the semiconductor structure 100, a circuit layout 102 includes numerous metal-oxide-semiconductor field effect transistors (MOSFETs). In some embodiments, the MOSFET contains a control gate and a floating gate that is separated from a source and a drain region contained in the circuit layout 102 by a layer of thin oxide.

The circuit layout 102 may vary in topography because of different number of deposition layers in different regions on the semiconductor structure during the lithographic process to meet various function requirements. The "topography" herein refers to a surface profile of the semiconductor structure. In various embodiments, the circuit layout 102 includes a high topography region 110 and a low topography region 120. In some embodiments, the high topography region 110 is a non-volatile memory (NVM) bitcell region and the low topography region 120 is a non-memory region. In some embodiments, the NVM bitcell region is a flash memory region or the flash memory gate stack, and the low topography region 120 is a logic region or a logic gate stack.

The flash memory region exhibits greater height than the logic region in that the flash memory region may include at least two additional layers of the inter-electrode dielectric gate and the floating gate, which are not required in the logic gate stack. In some embodiments, the high topography region 110 is the flash memory region or the flash memory gate stack, which is comprised of a large number of memory cells arranged in arrays. Each of the memory cells is an electrically chargeable field-effect transistor (FET). The data in a memory cell is thus determined by the presence or absence of a charge on the floating gate. For example, when the charges are removed from the floating gate by tunneling the electrons to the source through the oxide layer, the data is erased. On the other hand, the non-memory region, or the logic gate stack, are comprised of core circuits responsible for logical calculations, and is lower compared to the high topography region, and formed along with the flash memory region. Accordingly, the non-memory region forming a low topography region 120.

Figure 2A:
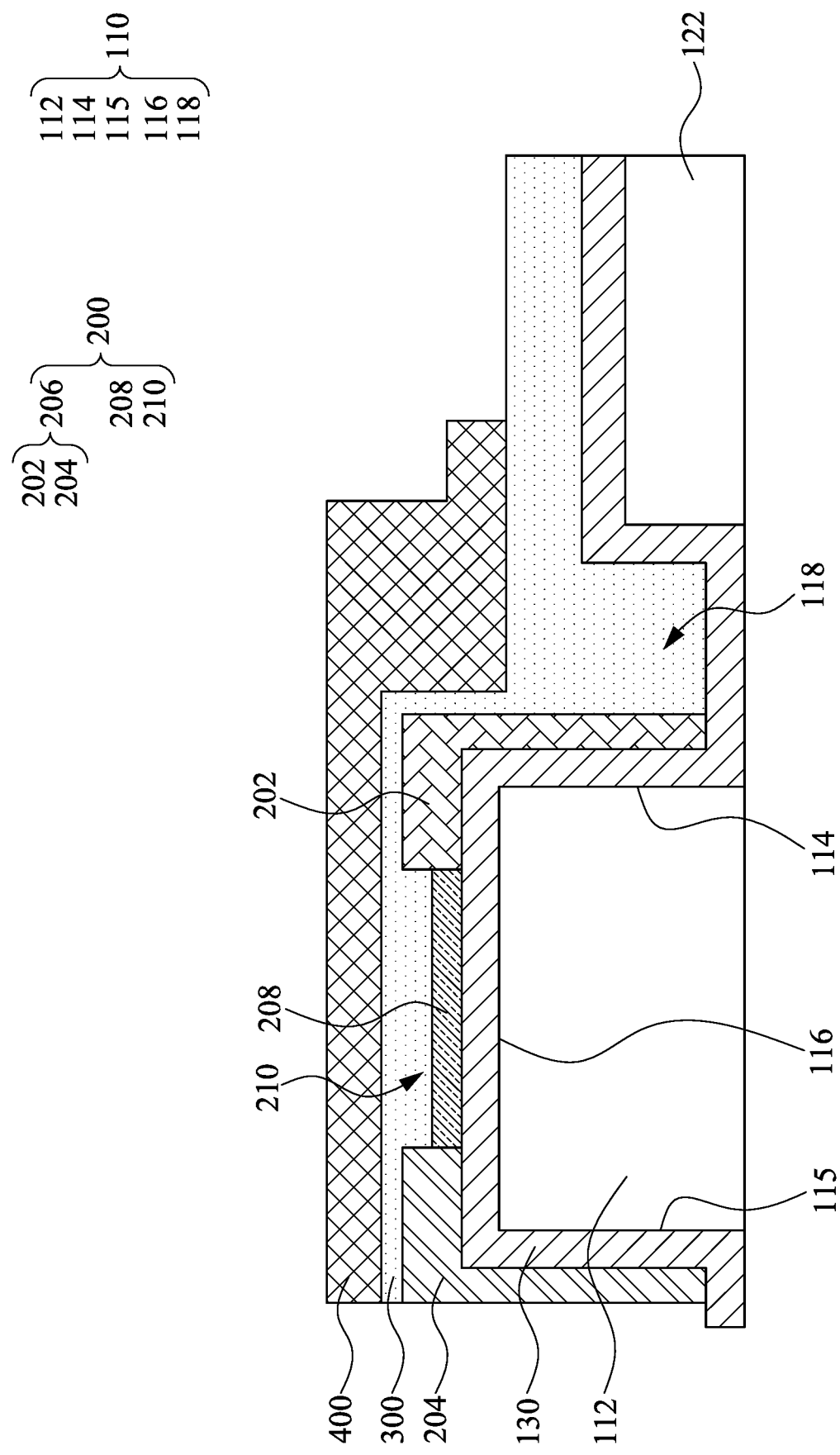
FIG. 2A-2B is the representative cross sectional side views of some embodiment illustrating an integrated circuit device in the process of forming a semiconductor structure.

Next, referring to FIG. 2A, it reveals an embodiment of the layout of a semiconductor device 100 with more of the difference between the high topography regions 110 and the low topography regions 120, the detailed display of additional layers applied to the circuit layout 102 to facilitate etching, and more elaboration on the protection of topography regions. The high topography region 110 is referred to as the first topography region, while the low topography region 120 is defined as the second topography region in some embodiments. In some embodiments, the height difference between the flash memory gate stack and the logic gate stack is between 500 to 1000 angstroms, but may be greater or less relying on the composition of each of the respective gate stacks. In some embodiments, besides the presence of the inter-electrode dielectric gate and the floating gate, the high topography region 110 contains more layers of polysilicon than that of the low topography region 120.

The integrated circuit devices are manufactured by employing a lithographic process. In the lithographic process, at least one layer of a photosensitive material, generally known as a photoresist material, is deposited on a substrate. The photoresist material may then be patterned by exposing it to radiation of a certain wavelength to alter characteristics of the photoresist material, such that a pattern is transferred from a photomask to a photoresist on a substrate. With the miniaturization of the integrated circuit devices, an anti-reflective coating (ARC) can be utilized on a substrate prior to applying the photoresist to address the transmissivity and reflectivity problems owing to thinner layers of the photoresist. The ARC attenuates or absorbs light reflected from the substrate surface during the lithographic process, so as to enhance image contrast of the photomask on the substrate. The ARC greatly reduces the impact of highly reflective substrate surfaces as well as the impact of topographical features on the substrate surface during radiation like deep UV imaging. In some embodiments, the ARC is either inorganic or organic films.

The photoresist is then patterned and remains in place while an underlying SiON and polysilicon are defined such as using reactive ion etching (RIE). The photoresist and SiON are then etched away using such as RIE and/or wet $H_2PO_4$ etching composition. A layer of a hard mask material can be utilized over the surface of the gate stacks as a protection film before depositing the ARC on the layer of hard mask material to protect the underlying the polysilicon gates, STI, gate oxides exposed otherwise.

Among the high topography region 110 and the low topography region 120, the high topography region 110 is more susceptible to the etching in the lithographic process than a lower topography area. Specifically, an edge of the high topography region 110 is apt to be rounded out during the etching operation. A protection film is applied to the entire higher topographic area completely prior to the application of the ARC, so as to prevent the high topography region 110 from damage of the etching. Nonetheless, because of the difference in height between the high topography regions 110 and the low topography regions 120, the ARC usually has difficulty being formed uniformly. If a uniform protection film is applied to cover the whole surface of the polysilicon of the high topography region 112, the thickness of the protection film will further add to the height of the high topography regions 110, causing the ARC to flow to the low topography region 120 and thus the thinning of BARC 300 on the polysilicon of the high topography regions 112, causing other residual issues on a boundary of the polysilicon of the high topography regions 112 during etching.

In other words, in applying the materials of the ARC over the high topography region for the subsequent photoresist depositing process, the fluidic material tends to flow into the low topography region 120, resulting in ARC thickness variation in the circuit layout 102. Relying on the proximity of the high topography regions 110 and low topography regions 120, the thin layer of the photoresist or layer of ARC can pile up on an area between the high topography region 110 and low topography region 120, which can barely be avoided on a densely fabricated substrate 102. The ARC thickness variation causes undesirable variation in the dimensions of the features transferred into the semiconductor structure. As a result, the difficulty to reach consistency in the thickness of the ARC layer across the polysilicon of the high topography regions 112 and the polysilicon of the low topography regions 122 can cause further problems in etching.

As shown in FIG. 2A, both the polysilicon of the high topography regions 112 and polysilicon of the low topography regions 122 are covered with a thin layer of hard mask 130 according to various embodiments. A polysilicon gate can be defined using a silicon oxinitride CVD. The ARC 300 conformably coated over a polysilicon layer. In other words, over the high topography regions 110, the low topography regions 120, and space between the regions lies a layer of anti-reflective coating (ARC) 300. A photoresist 400 is coated over the ARC 300. In various embodiments, a wall-like protection layer or protrusion 201 is applied on an edge of the high topography region 110 that includes a valley or trench 118 next to the low topography region 120. The material of the protection film can include various hard masks able to protect the high-topography regions from being etched. Since the layer of ARC 300 is typically at the bottom, the ARC is herein can be referred to as the bottom anti-reflective coating (BARC) layer according to various embodiments. Above the layer of bottom anti-reflective coating (BARC) 300 lies a photo-resist (PR) layer 400, which generally covers the high topography regions 110.

In various embodiments, take an embedded memory chip layout as an example, the high topography patterning is accomplished before the patterning of the surrounding low topography regions 120.

As a result, in various embodiments, a protrusion protection structure 200 is applied rather than the blanked protective film over an area that is locally higher. The protrusion protection structure 200 comprises protection walls on a periphery of the polysilicon of the high topography regions. The protrusion protection structure 200 can be referred to as a pool-like protection structure in some embodiments. The protrusion protection structure 200 can a hard mask, photoresist oxidation layer, or other material that can protect a central portion of the high topography region 116. The pool-like protection structure has a capacity to accommodate the fluid material of ARC in the ARC application, so as to prevent the material from flowing to the low topography region 120 and reduce the ARC variation.

The protection walls can be further categorized into an outer protection wall 202 and an inner protection wall 204, while the periphery of the high topography region can be further classified into an outer peripheral portion of the high topography region 114 and an inner peripheral portion of the high topography region 115.

The outer protection wall 202, herein designated as the first protection wall in some embodiments, stands on the outer peripheral portion of the high topography region 114 and next to the low topography region 120. The outer peripheral portion of the high topography region 114, referred to as the first peripheral portion of the first topography region in some embodiments, is a space between the high topography region 110 and the trench 118 between the high topography region 110 and the low topography region 120. The trench 118, referred to as a gorge in some embodiments, is also included in the high topography region 110, and is next to a TEOS Oxide/$Si_3N_4$/$N_2O$-plasma Oxide (ONO) poly gate on a periphery of the low topography region 120. In a word, the outer protection wall 202 is referred to as the first protection wall that are formed on the peripheral portion of the high topography region that is adjacent to the low topography region 120. In some embodiments, the outer protection wall 202 stands between the outer peripheral portion of the high topography region 114 which faces the low topography region 120 and the trench 118 which lines the junction of the high topography region 110 and the low topography region 120.

The inner protection wall 204, herein designated as the second protection wall in some embodiments, stands on the inner peripheral portion of the high topography region 115. The inner peripheral portion of the high topography region 115, referred to as the second peripheral portion of the first topography region in some embodiments, indicates the portion of the high topography region adjacent to another said high topography regions 110 or an edge of the substrate 102, making the inner protection walls 204 a combination of walls between different high topography regions 110 or between the high topography regions 110 and the edge of the substrate 102.

Apart from the outer peripheral portion of the high topography region 114 and the outer peripheral portion of the high topography region 115, the high topography region 110 contains a central portion of the high topography region 116. The central portion of the high topography region 116, also referred to as the central portion of the first topography region or the center of the first topography region, is covered with a layer of central protection film 208 with the height lower than the height of the outer protection wall 202 and the inner protection wall 204, forming a pool-like protection structure that is referred to as the protrusion protection structure 200 in some embodiments. In another word, the outer protection wall 202, the inner protection wall 204, and the central protection film 208 are collectively coupled to form the complete pool-like protection structure.

The pool-like protection structure 200 contains a higher portion around a periphery of the high topography region 206 and a lower portion in the center of the high topography region 210. The higher portion around a periphery of the high topography region 206, referred to as the higher portion around a periphery of the first topography region, includes the upper part of the outer protection wall 202 and the upper part of the inner protection wall 204. On the other hand, the lower portion in the center of the high topography region 210, referred to as the lower portion in the center of the first topography region or the central area of the protrusion protection structure in some embodiments, lies upon the central portion of the high topography region 116.

With the peripheral portion 206 higher than the central portion 210, the pool-like protection structure 200 retains more BARC 300 in the central portion of the high topography region 116, while preventing the outflow of BARC 300 to the trench 118 or to the low topography region 120, greatly improving the sensitivity of the etching process via absorbing more leaking lights across the layer of PR 400 by the thickened layer of BARC 300.

Furthermore, with the higher portion around a periphery of the high topography region 206 surrounding the central portion of the high topography region 116, the pool-like protection structure 200 not only deposits more BARC 300 in the center of the high topography region 116, but stores more BARC 300 on the ridges of the higher portion around a periphery of the high topography region 206 due to surface tension. The resulting thickening of the BARC 300 on the ridges of the higher portion around a periphery of the high topography region 206 can thus protect the periphery of the high topography region and eliminate residual issues on a boundary of the high topography regions 110 during etching.

Moreover, besides retaining BARC 300, the higher portion around a periphery of the high topography region 206 can also retain a thick layer of PR 400 both over the central portion of the high topography region 116, and on the ridges of the higher portion around a periphery of the high topography region 206, facilitating the photo-resist effect during etching.

Figure 2B:
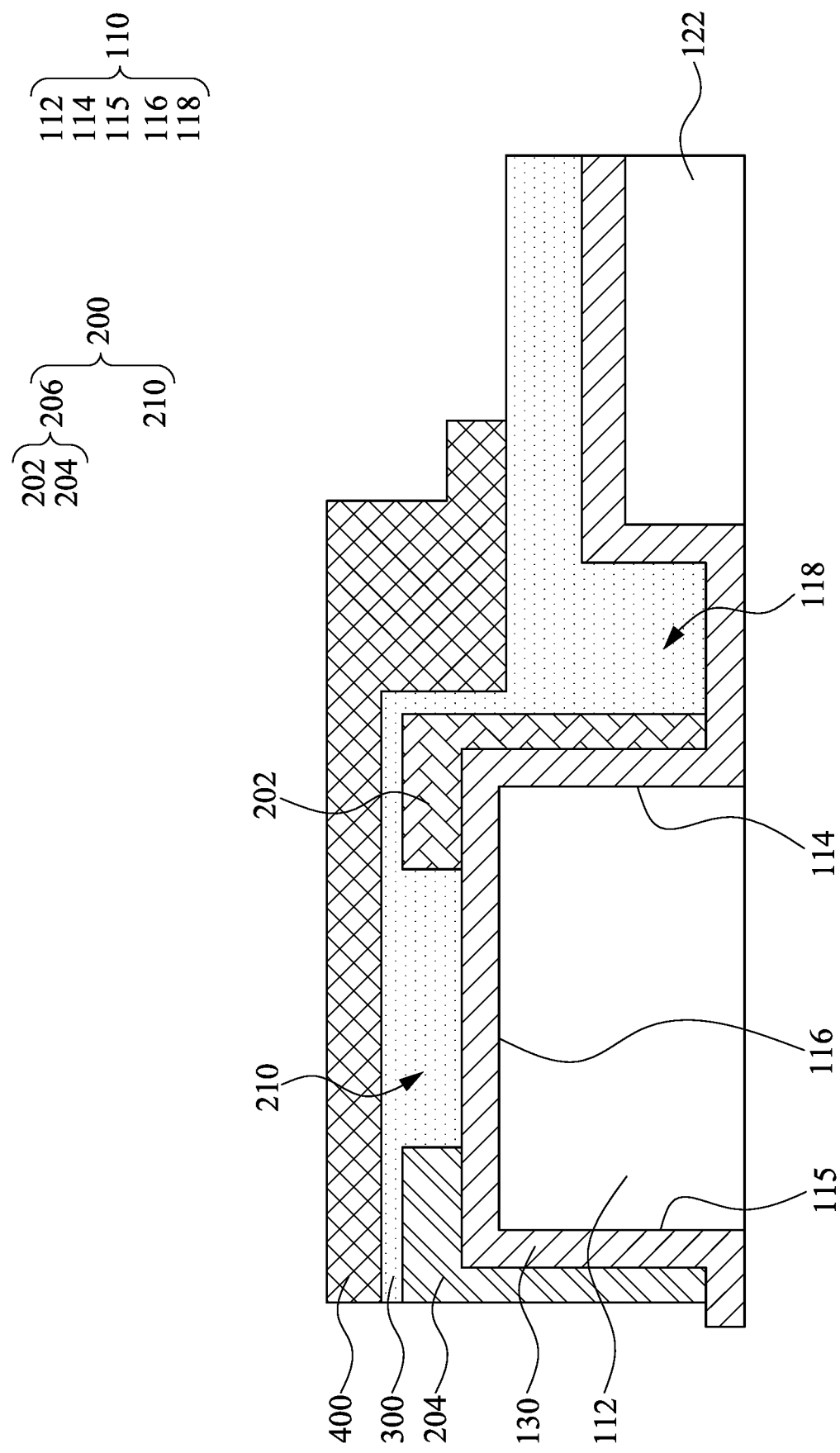

Turning to FIG. 2B, which is another embodiment of a semiconductor device 100. Among the protrusion protection structure 200, the higher portion around a periphery of the high topography region 206 is the contributing feature to the formation and functionality of the protrusion protection structure 200. To put it differently, the higher portion around a periphery of the high topography region 206 alone, inclusive of the outer protection wall 202 and the inner protection wall 204, is capable of retaining sufficiently thick layer of BARC 300 and PR 400, offering sufficient protection and facilitation during etching. Accordingly, once the height difference between the higher portion around a periphery of the high topography region 206 and the lower portion in the center of the high topography region 210 reaches a certain threshold, the height of the lower portion in the center of the high topography region 210 may not tremendously influence the effect of protection.

What can be inferred from this is that the height of the lower portion in the center of the high topography region 210, or virtually the thickness of the central protection film 208, can be as thin as possible. To be more extreme, the height of the lower portion in the center of the high topography region 210 can be infinitely thin, even reaching zero height. That is to say, the absence of the lower portion in the center of the high topography region 210, or virtually the absence of the central protection film 208, will not significantly affect the protection effect of the center of the high topography region 116.

Figure 3:
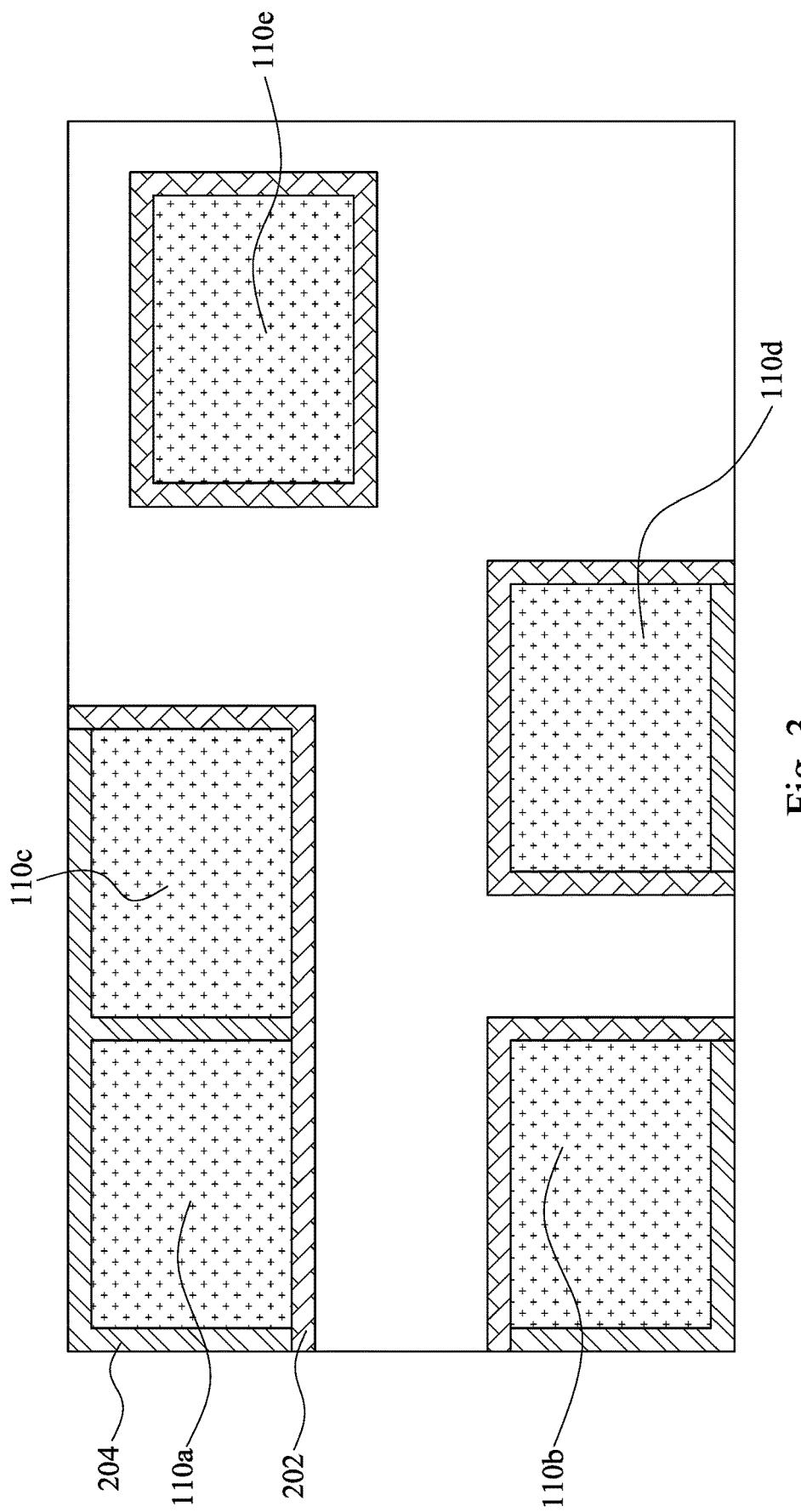
FIG. 3 is a representative top down view of a semiconductor structure in the process of forming a semiconductor structure, in accordance with some embodiments.

As shown in FIG. 3, there are various types of protrusion protection structures 200 comprised of different combinations of the outer protection walls 202 and the inner protection walls 204, giving rise to several embodiments as follows.

Take the rectangular high topography regions 110 for example, the high topography region 110a contains two inner peripheral portions of the high topography region 115 along the edges of the substrate 102, one inner peripheral portion of the high topography region 115 that is next to another high topography regions 110, and one outer peripheral portion of the high topography region 114 that is next to the low topography region 120. Hence, the high topography region 110a is surrounded by three inner protection walls 204 and one outer protection wall 202, altogether forming a ring-shaped pattern.

The high topography region 110b contains two inner peripheral portions of the high topography region 115 along the edges of the substrate 102 and two outer peripheral portions of the high topography region 114 that is next to the low topography region 120. Thus, the high topography region 110b is surrounded by two inner protection walls 204 and two outer protection walls 202, with the outer protection walls 202 in the form of a L-shaped structure, altogether forming the ring-shaped pattern with the inner protection walls 204.

The high topography region 110c contains one inner peripheral portion of the high topography region 115 along the edge of the substrate 102, one inner peripheral portion of the high topography region 115 that is next to another high topography regions 110, and two outer peripheral portions of the high topography region 114 that is next to the low topography region 120. Therefore, the high topography region 110c is surrounded by two inner protection walls 204 and two outer protection walls 202, with the outer protection walls 202 in the form of a L-shaped structure, altogether forming the ring-shaped pattern with the inner protection walls 204.

The high topography region 110d contains one inner peripheral portion of the high topography region 115 along the edge of the substrate 102 and three outer peripheral portions of the high topography region 114 that is next to low topography region 120. As a result, the high topography region 110d is surrounded by one inner protection wall 204 and three outer protection walls 202, with the outer protection walls 202 in the form of a C-shaped structure, altogether forming the ring-shaped pattern with the inner protection walls 204.

The periphery of the high topography region 110e contains four outer peripheral portions of the high topography region 114 that is next to the low topography regions 120. Accordingly, the high topography region 110e is surrounded by four outer protection walls 202, with the outer protection walls 202 in the form of a ring-shaped structure, altogether forming the ring-shaped pattern with the inner protection walls 204.

To be brief, with distinct combinations and coupled structure of the outer protection walls 202 and the inner protection walls 204, the higher portion of the pool-like protection structure 206 can have ring-shaped sidewalls in rectangular, circular, or rhombic form to protect the high topography regions 110.

Figure 4:
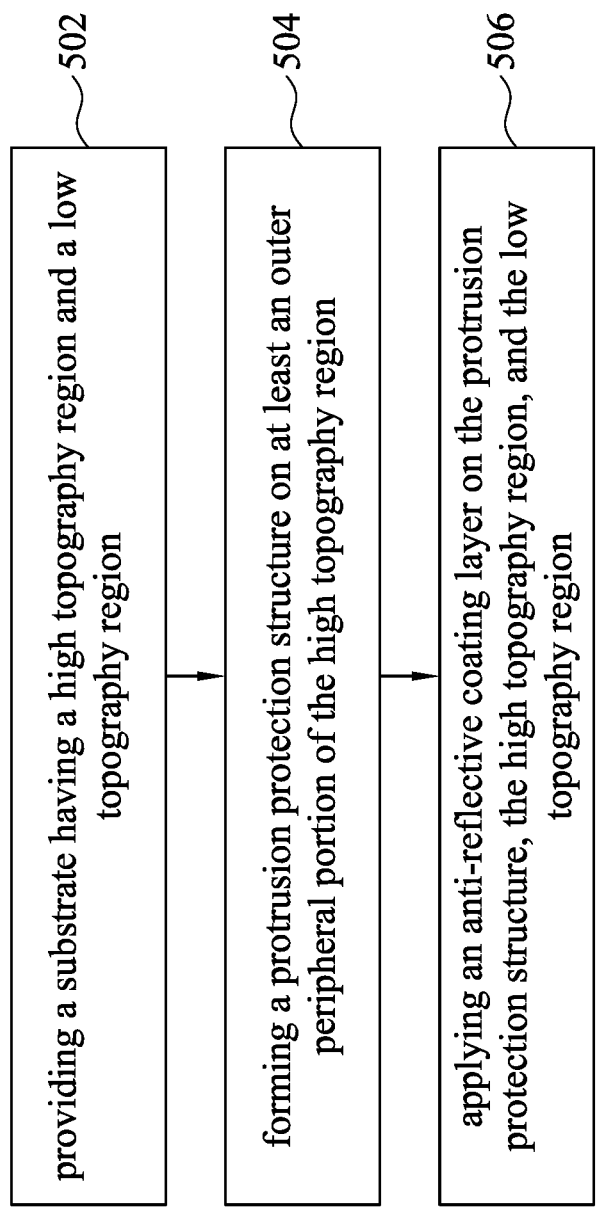
FIG. 4 is a process flow diagram of forming a semiconductor structure, in accordance with some embodiments.

Referring next to FIG. 4, which reveals a method for forming the semiconductor structure 100, also referred to as the semiconductor device in some embodiments, the method includes the procedure 502 of providing a substrate 102 containing a high topography region 110 and a low topography region 120. The provided substrate 102 may exhibit not only the topography difference, but the trenches 118 lining the boundaries of the high topography region 110 and the low topography region 120. After such substrate 102 is provided, the procedure 504 of forming a protrusion protection structure 200 on at least an outer peripheral portion of the high topography region 114 should then be performed. The procedure 504 involves firstly a procedure of forming an outer protection wall 202 on an outer peripheral portion of the high topography region 114, and subsequently the procedure of forming one or more inner protection walls 204 on an inner peripheral portion of the high topography region 115.

In some embodiments, the protrusion protection structure 200 is a hard mask material. In an embodiment, the layer of hard mask material is titanium nitride or a silicon dioxide obtained from tetraethyloxysilane (TEOS). The TEOS is deposited by chemical vapor deposition (CVD) or plasma-enhanced CVD to a thickness of about 100 to about 1000 angstroms, and more typically about 400 to about 600 angstroms. The TEOS is reacted with oxygen or ozone to provide the silicon oxide hard mask material. In some embodiments, a hard mask materials include phosphosilicate glass (PSG), borophosphosilicate glass (BPSI), silicon oxynitride and thermally grown silicon dioxide.

Following the procedure 504 of forming a protrusion protection structure 200, the procedure 506 of applying an anti-reflective coating (ARC) 300 over the protrusion protection structure 200, the high topography region 110, and the low topography region 120 should be operated. Due to the higher portion around a periphery of the high topography region 206 in the protrusion protection structure 200, the thickness of the layer of ARC 300 and PR 400 can be maintained in the lower portion in the center of the high topography region 210 on top of the central portion of the high topography region 116, and on the ridges of the higher portion around a periphery of the high topography region 206. Since it is the higher portion around a periphery of the high topography region 206 that is the most attributed factor for the retaining of ARC 300 and PR 400 in the lower portion in the center of the high topography region 210, the lower portion in the center of the high topography region 210, or the central area of the protrusion protection structure, can have zero height. Besides, after the procedure 506 of applying the layer of ARC 300, the additional procedure of applying the layer of PR 400 onto the protrusion protection structure 200 and the high topography region 110 can also be performed.

The protrusion protection structure 200 optimizes not only the protection of the central portion of the high topography region 116, but also the protection of the outer peripheral portion of the high topography region 114 and the inner peripheral portion of the high topography region 115 from residual damage of etching.

In accordance with some embodiments, the semiconductor structure 100 includes a substrate 102 containing a high topography region 110 and a low topography region 120, an outer protection wall 202 on an outer peripheral portion of the high topography region 114 next to the low topography region 120, and an anti-reflective coating 300 over the outer protection wall 202, the high topography region 110, and the low topography region 120.

In accordance with some embodiments, the integrated circuit device 100 includes a substrate 102 containing a high topography region 110 and a low topography region 120, a pool-like protection structure 200 on the high topography region 110, wherein the pool-like protection structure 200 contains a higher portion around a periphery of the high topography region 206 and a lower portion in the center of the high topography region 210, and an anti-reflective coating 300 over the pool-like protection structure 200, the high topography region 110, and the low topography region 120.

In accordance with some embodiments, the method for forming a semiconductor structure 100 includes the procedure 502 of providing a substrate 102 comprising a high topography region 110 and a low topography region 120, the procedure 504 of forming a protrusion protection structure 200 on at least an outer peripheral portion of the high topography region 114 next to the low topography region 120, and the procedure 506 of applying an anti-reflective coating 300 over the protrusion protection structure 200, the high topography region 110, and the low topography region 120.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, wherein the method comprises:
    providing a semiconductor substrate comprising a first topography region and a second topography region, wherein the first topography region is a gate stack and is higher than and adjacent to the second topography region, the first topography region having a first peripheral portion, a second peripheral portion and a central area between the first peripheral portion and the second peripheral portion;
    forming a protrusion protection structure on at least the first peripheral portion of the first topography region, thereby forming a recess over the central area of the first topography region, wherein the first peripheral portion of the first topography region is next to the second topography region; and
    applying an anti-reflective coating over the protrusion protection structure, in the recess over the first topography region, and the second topography region.

2. The method of claim 1, wherein forming the protrusion protection structure further comprises:
    forming a first protection wall on the first peripheral portion of the first topography region; and
    forming one or more second protection walls on the second peripheral portion of the first topography region.

3. The method of claim 2, wherein the first protection wall and the one or more of the second protection walls form a L-shaped, C-shaped, or ring-shaped pattern.

4. The method of claim 1, wherein forming the protrusion protection structure is conducted by forming the protrusion protection structure with zero height in the central area of the protrusion protection structure.

5. The method of claim 1, wherein the first topography region comprises a trench next to the first peripheral portion of the first topography region.

6. The method of claim 5, wherein the trench is next to the second topography region.

7. The method of claim 6, wherein a top surface of the first topography region and a top surface of the second topography region are both higher than a bottom of the trench.

8. The method of claim 1, wherein after applying the anti-reflective coating, the method further comprises:
    forming a photoresist layer over the first topography region.

9. A method for forming a semiconductor structure, wherein the method comprises:
    forming a semiconductor stack protruding from a substrate;
    after forming the semiconductor stack, forming a hard mask covering the semiconductor stack;
    forming a protection structure on the semiconductor stack, wherein the protection structure encircles a periphery of the semiconductor stack and covers a portion of a top surface of the semiconductor stack, thereby forming a recess over the semiconductor stack; and
    applying an anti-reflective coating covering the protection structure, wherein the anti-reflective coating comprises a first portion formed in the recess, a second portion overlying the protection structure and a third portion covering a sidewall of the protection structure.

10. The method of claim 9, wherein the hard mask is formed from titanium nitride, silicon oxide, phosphosilicate glass (PSG), borophosphosilicate glass (BPSI), and silicon oxynitride.

11. The method of claim 9, wherein the protection structure is formed from a hard mask material.

12. The method of claim 9, wherein after forming the protection structure on the semiconductor stack, the method further comprises:
    forming a protection film on the top surface of the semiconductor stack, wherein a top surface of the protection film is lower than a top surface of the protection structure.

13. The method of claim 9, wherein the anti-reflective coating comprises a fourth portion adjoining the third portion, and a top surface of the fourth portion is lower than a bottom of the second portion.

14. The method of claim 9, wherein after applying the anti-reflective coating, the method further comprises:
    forming a photoresist layer over the semiconductor stack.

15. A method for forming a semiconductor structure, wherein the method comprises:
    forming a first semiconductor structure and a second semiconductor structure on a substrate, wherein the first semiconductor structure and the second semiconductor structure are apart a trench, the first semiconductor structure and the second semiconductor structure both adjoin the trench, the first semiconductor structure is higher than the second semiconductor structure, and a top surface of the first semiconductor structure and a top surface of the second semiconductor structure are both higher than a bottom of the trench;
    forming a hard mask over the first semiconductor structure, the second semiconductor structure, and the bottom of the trench;
    forming a pool-like protection structure on the hard mask covering the first semiconductor structure, wherein the pool-like protection structure encloses a periphery of the first semiconductor structure and covers a portion of a top surface of the hard mask, thereby exposing an uncovered portion of the top surface of the hard mask;
    forming a protection film covering the uncovered portion of the top surface of the hard mask, wherein a top surface of the protection film is lower than a top surface of the pool-like protection structure; and
    applying an anti-reflective coating over the pool-like protection structure, the protection film, and the second semiconductor structure, wherein the trench is filled with the anti-reflective coating.

16. The method of claim 15, wherein the hard mask is formed from titanium nitride, silicon oxide, phosphosilicate glass (PSG), borophosphosilicate glass (BPSI), and silicon oxynitride.

17. The method of claim 15, wherein the pool-like protection structure is formed from a hard mask material.

18. The method of claim 15, wherein the anti-reflective coating comprises a first portion overlying the first semiconductor structure, a second portion overlying the second semiconductor structure and a third portion formed in the trench, and a bottom of the third portion is lower than a top surface of the first portion and a top surface of the second portion.

19. The method of claim 15, wherein after applying the anti-reflective coating, the method further comprises:
   forming a photoresist layer over the first semiconductor structure and the trench.

20. The method of claim 1, further comprising:
   after providing the semiconductor substrate, forming a hard mask covering the first topography region.

* * * * *